United States Patent
Nakayama et al.

(10) Patent No.: US 6,893,576 B1
(45) Date of Patent: May 17, 2005

(54) METHOD OF MANUFACTURING MULTI-LAYER PRINTED WIRING BOARD

(75) Inventors: Akitaka Nakayama, Kawasaki (JP); Akio Ikeda, Kawasaki (JP); Kiyoshi Hyodo, Kawasaki (JP); Kazuo Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 09/713,036

(22) Filed: Nov. 16, 2000

(30) Foreign Application Priority Data

Feb. 28, 2000 (JP) ..................................... 2000-051406

(51) Int. Cl.⁷ ........................... H01B 13/00; G03F 7/26
(52) U.S. Cl. ........................... 216/13; 216/41; 430/311; 174/263; 174/265; 174/266
(58) Field of Search ..................... 216/13, 41; 174/263, 174/265, 266; 430/311

(56) References Cited

U.S. PATENT DOCUMENTS

| | | | |
|---|---|---|---|
| 4,666,818 A | | 5/1987 | Lake et al. .................. 430/256 |
| 5,015,553 A | * | 5/1991 | Grandmont et al. |
| 5,134,056 A | * | 7/1992 | Schmidt et al. ............... 427/96 |
| 5,254,435 A | | 10/1993 | Grandmont et al. ........ 430/260 |
| 5,402,314 A | * | 3/1995 | Amago et al. ............... 174/260 |
| 5,464,662 A | * | 11/1995 | Murakami et al. .......... 427/259 |
| 5,493,077 A | * | 2/1996 | Demura ...................... 174/262 |
| 5,837,426 A | | 11/1998 | Tseng et al. ................ 430/311 |
| 5,897,938 A | * | 4/1999 | Shinmoto et al. ........... 428/203 |
| 6,001,537 A | * | 12/1999 | Ohsumi et al. ............. 430/313 |
| 6,346,678 B1 | * | 2/2002 | Kono et al. .................. 174/255 |

FOREIGN PATENT DOCUMENTS

| | | |
|---|---|---|
| JP | 62-198190 | 9/1987 |
| JP | 63-190 | 1/1988 |
| JP | 5-41580 | 2/1993 |
| JP | 6-97635 | 4/1994 |
| JP | 7-25129 | 1/1995 |
| JP | 7-263845 | 10/1995 |
| JP | 10048835 A | 2/1998 |
| WO | WO 88/04797 A1 | 6/1988 |

OTHER PUBLICATIONS

Japanese Office Action dated Jun. 15, 2004 in the corresponding Japanese patent Application No. 2000–051406 with English translation.

* cited by examiner

Primary Examiner—Nadine G. Norton
Assistant Examiner—Shamim Ahmed
(74) Attorney, Agent, or Firm—Westerman, Hattori, Daniels & Adrian, LLP

(57) ABSTRACT

This invention is a method of manufacturing a multi-layer printed wiring board including an internal layer circuit forming step, a outer layer circuit forming step, and a solder resist forming step. In the solder resist forming step, the surface of a board subjected to the outer layer circuit forming step is coated with a photosensitive solder resist material, the solder resist material is coated with a photosensitive film; a light shielding mask is formed by irradiating a laser beam on the photosensitive film according to a formed pattern of the solder resist, the solder resist material is exposed by using the light shielding mask, the light shielding mask is removed, and the solder resist material which is not exposed is removed.

16 Claims, 7 Drawing Sheets

METHOD OF MANUFACTURING MULTI-LAYER PRINTED WIRING BOARD

BACKGROUND OF THE INVENTION

1. Field of the Invention

The present invention relates to a method of manufacturing a multi-layer printed wiring board.

2. Description of the related art

In recent years, with diversification of users, the types of the printed wiring boards increase, and the life cycles of the printed wiring boards are shortened. For this reason, the manufacturing mode of the printed wiring boards shifts from a conventional inflexible mass production mode to a flexible manufacturing mode.

The printed wiring boards manufactured by a flexible manufacturing system, for example, are used as circuit boards on which circuits for computers (e.g., host computers, computers controlling a security system for dams or buildings) electronic switching systems (digital switching systems: e.g., switching system used in a direct center (DC) or a regional center (RC)), a wireless device (e.g., compact portable telephone), an optical transmission device (e.g., optical submarine cable repeater), PCM transmission system or the like, are mounted. Generally, one to five piece of printed wiring boards of one type, or, at most, ten piece of printed wiring boards of one type are manufactured in once-manufacturing.

The processes in manufacturing a multi-layer printed wiring board comprise an internal layer circuit forming process, an outer layer circuit forming process, a solder resist (also called a "permanent resist") forming process, and a marking (character printing) process.

Conventionally, the internal layer circuit forming process and the outer layer circuit forming process, for example, an art work film which is formed to remain a conductive pattern as a positive pattern is prepared in advance. Thereafter, the art work film is placed on the surface of a board (substrate) in which a patterning material is covered with a photosensitive film which is photo-hardened, and is irradiated with ultraviolet rays. Thereafter, the art work film is removed, the photosensitive film of a negative pattern portion (portion which is not irradiated with ultraviolet rays) is removed to form an etching resist is formed on the board. Thereafter, the patterning material of the negative pattern portion is etched according to the etching resist, and the photosensitive film of a positive pattern portion (portion which is hardened with ultraviolet-rays-irradiation) is removed. In this manner, an internal layer circuit and an outer layer circuit are formed.

In the solder resist forming process, for example, an art work film formed to remain a positive pattern according to a solder resist pattern is prepared in advance. Thereafter, a solder resist material is coated on the surface of a board on which an outer layer circuit is formed, and the art work film is placed on the solder resist material and irradiated with ultraviolet rays. Thereafter, the art work film is removed, and the solder resist material of the negative pattern portion is removed. In this manner, a solder resist is formed.

In the marking process, a screen plate for a predetermined mark is prepared in advance. By the screen printing using the screen plate, the predetermined mark is printed on a board.

In the method of forming an etching resist (photoresist) or a solder resist by using the art work film (and screen plate), the art work films corresponding to the respective processes must be prepared depending on circuit patterns to be formed. For this reason, in a state of a flexible manufacturing system, the manufacturing cost of the art work film disadvantageously increases.

In addition, the art work film is reserved to be used again. However, when the art work film is distorted or expands and contracts, the art work film cannot be used. For this reason, the keeping is cumbersome and requires a great cost. In particular, in the state of a flexible manufacturing system, an art work film which is rarely used may be keep, and the cost required for keeping may be posed as a problem.

Therefore, a method of forming an etching resist or a solder resist by excluding use of an art work film is desired. Conventionally, the arts in which use of art work films are excluded are as follows:

(1) a method of irradiating ultraviolet rays on a solder resist coated on a substrate in the solder resist forming step (see Japanese Patent Application Laid-Open Publication No. 6-97635);

(2) a method of irradiating a laser beam on a solder resist coated on a substrate in the solder resist forming step (see Japanese Patent Application Laid-Open Publication No. 6-97635);

(3) a method of injecting and coating a solder resist ink on a substrate by an inkjet printer in the solder resist forming step (see Japanese Patent Application Laid-Open Publication No. 6-97635 and 7-263845);

(4) a method of irradiating ultraviolet rays or a laser beam on a marking ink coated on a substrate in the marking step (see Japanese Patent Application Laid-Open Publication No. 6-97635);

(5) a method of injecting and coating a marking ink on a substrate by an inkjet printer in the marking step (see Japanese Patent Application Laid-Open Publication No. 6-97635);

(6) a method of forming a via hole by exposing a photosensitive resin on a substrate by using an exposure laser in the circuit forming step (see Japanese Patent Application. Laid-Open Publication No. 10-48835);

(7) a method of forming an etching resist by the step in which patterning exposure is directly performed by a vector scheme using an electronic beam in the circuit forming step (see Japanese Patent Application Laid-Open Publication No. 6-2198190); and (8) a method of forming a plating resist by the step in which patterning exposure is directly performed by a vector scheme using an electronic beam in the circuit forming step (see Japanese Patent Application Laid-Open Publication No. 63-190).

However, the above prior arts have the following problems.

As the first problem, the art (2) described above is a technique in which a spot laser is directly irradiated on a solder resist material to expose the solder resist material. At present, as the solder resist material, an epoxy resin is mainly used. Ultraviolet rays are used in an exposure process for the epoxy resin. For this reason, an ultraviolet laser is used as the spot laser. However, at present, an output of the ultraviolet laser is not sufficient to directly irradiate the ultraviolet laser beam on the solder resist material to expose the solder resist material.

For this reason, time required to directly expose a solder resist material by using an ultraviolet laser is too long. In the art (2), a laser output is increased by focusing a laser beam.

However, the laser output of a laser irradiation device itself does not increase, and an area in which the exposure process can be performed decreases per unit time because an irradiation area of the laser beam is decreased by focusing the laser beam. For this reason, time required for the exposure process does not change regardless of the focus of the laser beam.

In this manner, at present, the exposure process for the solder resist material by direct irradiation of a laser beam can be technically realized. However, the exposure process requires time which is considerably longer than that required when an exposure process is performed by using an art work film. For this reason, the exposure process using direct irradiation of a laser beam is not preferable in manufacturing efficiency.

As the second problem, each of the arts (1) to (8) is made to use an art work film for a certain step, and has no point of view for forming an etching resist or a solder resist (sharing a resist forming method) by using the same device and the same material in the internal layer circuit forming process, the outer layer circuit forming process, and the solder resist forming process. For this reason, the number of devices and the number of materials related to the processes in manufacturing a multi-layer printed wiring board increase.

SUMMARY OF THE INVENTION

It is the first object of the present invention to provide a method of manufacturing a multi-layer printed wiring board which excludes use of an art work film to be reserved and which does not decrease the manufacturing efficiency of the multi-layer printed wiring board.

It is the second object of the present invention to provide a method of manufacturing a multi-layer printed wiring board which excludes use of an art work film and which shares a device used in an internal layer circuit forming process, an outer layer circuit forming process, and a solder resist forming process.

The present invention is made to achieve the first object described above. More specifically, the first invention of the present invention is a method of manufacturing a multi-layer printed wiring board comprising an internal layer circuit forming step, a outer layer circuit forming step and a solder resist forming step. The internal layer circuit forming step and the outer layer circuit forming step comprise steps of: the step of coating the surface of a substrate coated with a patterning material with a photosensitive film; the step of exposing the photosensitive film according to a predetermined conductive pattern; the step of forming an etching resist by removing a portion of the photosensitive film which is not exposed from the board; the step of removing the patterning material from the board according to the etching resist; and the step of removing the etching resist from the board. The solder resist forming step includes: the step of coating the surface of the board subjected to the outer layer circuit forming step with a photosensitive solder resist material; the step of coating the solder resist material with a photosensitive film; the step of forming a light shielding mask by irradiating a laser beam on the photosensitive film according to a formed pattern of the solder resist; the step of exposing the solder resist material by using the light shielding mask; the step of removing the light shielding mask; and the step of removing the solder resist material which is not exposed due to the light shielding mask.

According to the present invention, a laser beam is irradiated on a photosensitive film to form a light shielding mask for an exposure process, and an exposure process for a solder resist material is performed by using the light shielding mask. The manufacturing cost of the light shielding mask is lower than the manufacturing cost and the reserving cost of a conventional art work film. For this reason, even though the light shielding mask is wasted (disposable) after the light shielding mask is used once, it is sufficiently payable that the multi-layer printed wiring board is manufactured.

By using the light shielding mask, the same exposure process as that performed when a conventional art work film is used can be performed. For this reason, as in the art (2) described in the background of the invention, a drawback that an exposure process requires very long time can be solved. More specifically, the manufacturing efficiency of the multi-layer printed wiring board does not have to be reduced.

The present invention can also be applied to a multi-layer printed wiring board which is manufactured by an inflexible mass-production method. However, the present invention is preferably applied to a multi-layer printed wiring board which is manufactured by a flexible manufacturing system. In this manner, a problem related to the manufacturing cost and the reserving cost of an art work film which are considerable especially in the state of a flexible manufacturing system can be solved.

The present invention has the following configuration to achieve the second object. More specifically, the second invention of the present invention is a method of manufacturing a multi-layer printed wiring board in which, in the first invention, in the internal layer circuit forming step and the outer layer circuit forming step, an etching resist is formed by using the same laser irradiation device as the laser irradiation device used to form a light shielding mask in a solder resist forming step.

According to the second invention, a device used in the steps in manufacturing a multi-layer printed wiring board can be shared. In this case, one laser irradiation device may be used in the internal layer circuit forming step, the outer layer circuit forming step, and the solder resist forming step, and the same laser irradiation device is arranged for the internal layer circuit forming step, the outer layer circuit forming step, and the solder resist forming step to perform the respective steps.

According to the present invention, there can be provided a method of manufacturing a multi-layer printed wiring board which excludes use of an art work film to be reserved and which does not decrease the manufacturing efficiency of the multi-layer printed wiring board.

According to the present invention, there can be provided a method of manufacturing a multi-layer printed wiring board which excludes use of an art work film and which shares a device used in an internal layer circuit forming step, a outer layer circuit forming step, and a solder resist forming step.

DESCRIPTION OF THE PREFERRED EMBODIMENT

Figure 1:
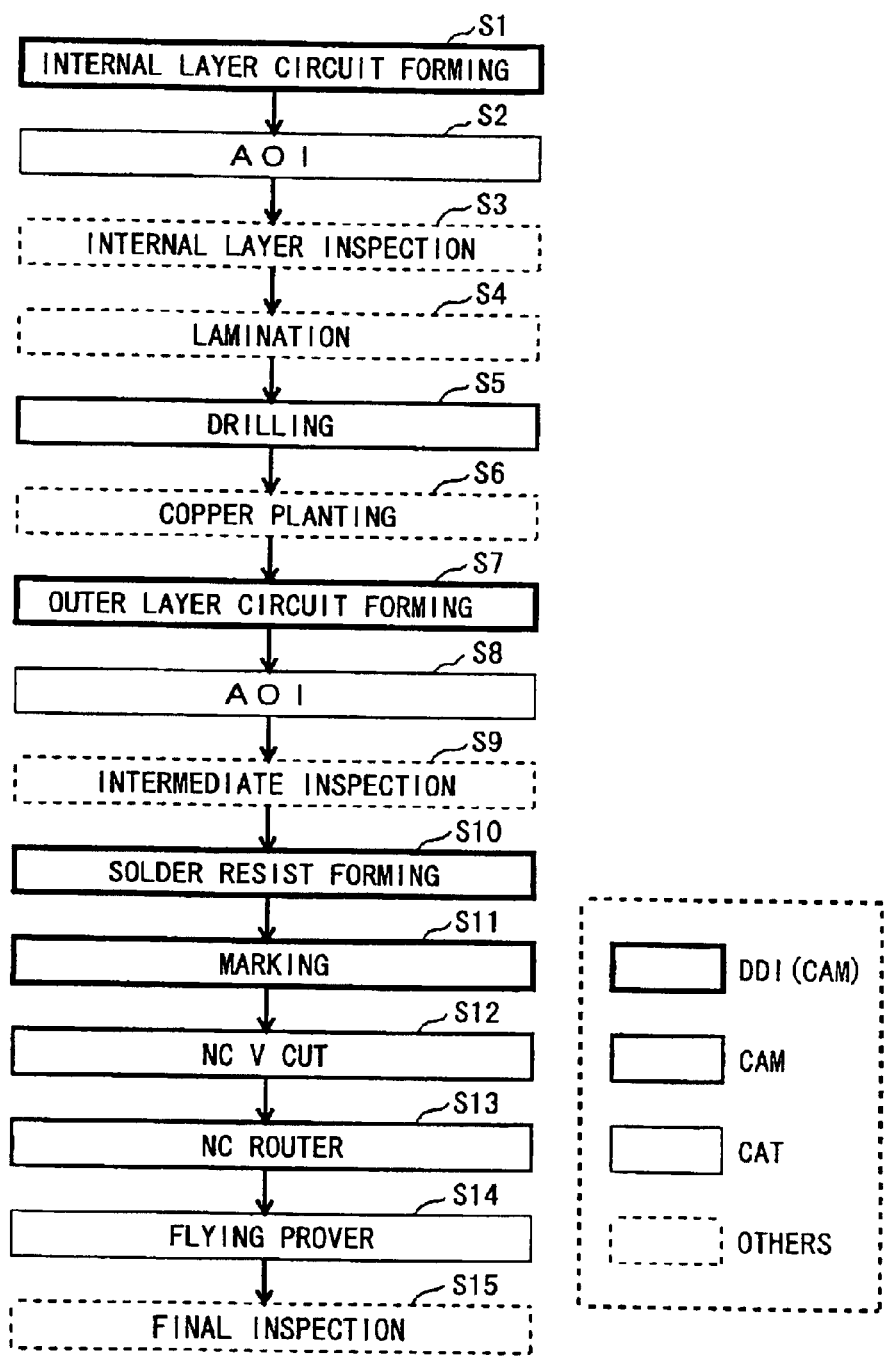
FIG. 1 is a flow chart for explaining the processes in manufacturing a multi-layer printed wiring board.
Figure 2:
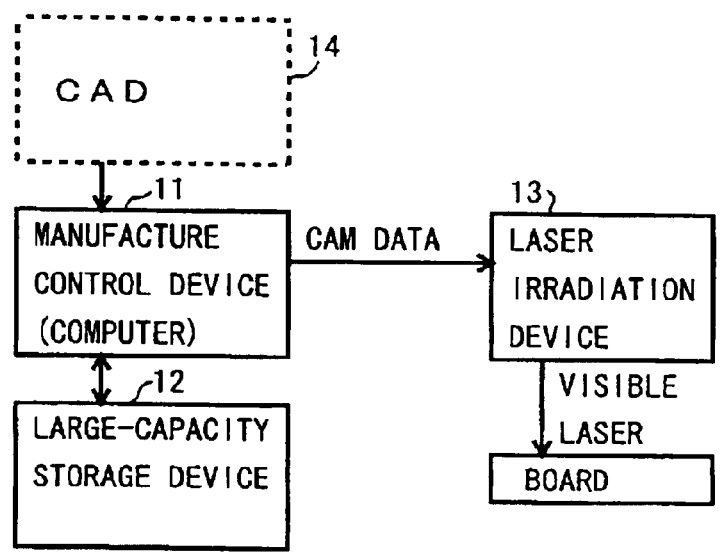
FIG. 2 is a block diagram showing a laser irradiation system.
Figure 3:
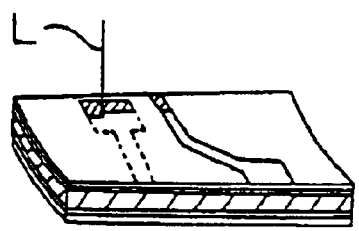
FIG. 3 is a perspective view for explaining an internal layer circuit forming process.
Figure 4:
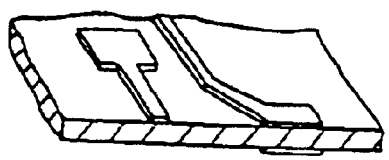
FIG. 4 is a perspective view for explaining an internal layer circuit forming process.
Figure 5:
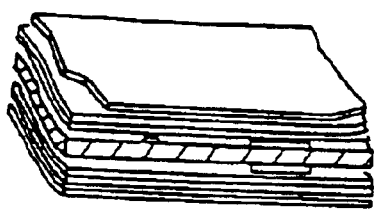
FIG. 5 is a perspective view for explaining a lamination process.
Figure 6:
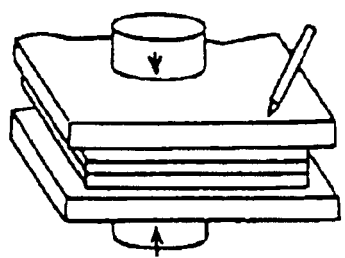
FIG. 6 is a perspective view for explaining a lamination process.

An embodiment of the present invention will be described below with reference to the drawings. FIG. 1 is a flow chart for explaining the steps in manufacturing a multi-layer printed wiring board according to the embodiment, and FIG. 2 is a block diagram showing a laser irradiation system used in the manufacturing processes shown in FIG. 1. Each FIGS. 3 to 14 is perspective views for explaining the respective processes shown in FIG. 1. The processes shown in FIG. 1 will be described below. The manufacturing processes are mainly applied to manufacture a multi-layer printed wiring board which is manufactured by a flexible manufacturing system.

[Internal Layer Circuit Formation]

In an internal layer circuit forming process (step S1), first, copper plated laminate boards for an internal layer circuit (girt laminate for internal layer circuits: to be referred to a "board" or "substrate" hereinafter) are prepared. The board is constituted by an insulating plate and a copper film serving as a patterning material plated on both the surfaces of the insulating plate.

Photosensitive films (dry films) are laminated on both the surfaces of the board by a known method. In this example, as the material of the photosensitive film, a material which is hardened by visible light of 5 millijoule may be used. Here, for example, "Riston FMA series" available from Mitsubishi-Dupont corporation is used.

The board is arranged at an appropriate position, and photoresists (etching resists for etching copper films) for forming a conductive pattern of an internal layer circuit by using the laser irradiation system shown in FIG. 2 are formed on both the surfaces of the board.

In FIG. 2, the laser irradiation system comprises a manufacture control device 11 for a multi-layer printed wiring board, a large-capacity storage device 12, and a laser irradiation device 13 (corresponding to a forming device according to the present invention).

The manufacture control device 11 is a computer such as a work station for managing and controlling the processes in manufacturing a multi-layer printed wiring board. The manufacture control device 11 receives computer aided design (CAD) data, computer aided manufacturing (CAM) data, and computer aided testing (CAT) data related to a multi-layer printed wiring board designed by a CAD system 14 and stores these data in the large-capacity storage device 12. Thereafter, the manufacture control device 11 gives appropriate data stored in the large-capacity storage device 12 to the devices related to the steps in manufacturing the multi-layer printed wiring board depending on the manufacturing statuses of the multi-layer printed wiring board.

The laser irradiation device 13 irradiates a visible laser beam on an appropriate position according to the CAM data given from the manufacture control device 11. In this example, an argon laser beam of a wavelength of 488 nm and an output of 5 millijoule is irradiated.

When the board is arranged at a predetermined position the laser irradiation device 13 irradiate a laser beam L (see FIG. 3) on a portion where a photosensitive film must be left by raster scanning according to the CAM data related to the conductive pattern of the internal layer circuit. More specifically, a positive pattern is drawn according to the conductive pattern of the internal layer circuit is drawn on the surface of the board. In this manner, the portion, on which the laser beam is irradiated, of the photosensitive film is hardened. As the scanning method of the laser beam, a vector scanning method may be used.

Upon completion of the drawing of the positive patterns on both the surfaces of the board, a developing process is performed by a known method. In this manner, only the exposed portion (positive pattern portion), on which the laser beam is irradiated, of the photosensitive film is left, and the unexposed portion (negative pattern portion), on which the laser beam is not irradiated, is removed. In this manner, an etching resist according to the conductive pattern of the internal circuit is formed.

Thereafter, a copper film is etched according to the etching resist, and the copper film on the negative pattern portion is removed. As the etching method, a known etching method can be used, and either of a wet etching method and a dry etching method may be used.

Upon completion of the etching, the etching resist is removed. As described above, the conductive pattern of the internal layer circuit is formed (see FIG. 4). Note that the board subjected to the internal layer circuit forming step is called an "internal layer board".

[AOI and Internal Layer Inspection]

Upon completion of the internal layer circuit forming process (step S1), the auto optical inspection (AOI) is performed (step S2). The CAT data related to the AOI is given from the manufacture control device 11 to an automatic profile inspection device (not shown). The automatic profile inspection device inspects the presence/absence of a short circuit or a disconnection of the internal layer circuit formed on the internal layer board.

Thereafter, when "normal" is determined by the AOI (A2), an internal layer inspection of the board is performed (S3). As described above, a plurality of internal layer boards constituting a multi-layer printed wiring board are formed.

[Laminating]

When all the internal layer boards constituting the multi-layer printed wiring board passing the internal layer inspection (step S3), the laminating process (step S4) is performed. More specifically, the plurality of internal layer boards are combined to each other in an appropriate order (see FIG. 5), and are laminated by a laminating device (not shown) (see FIG. 6).

[NC drill (Drilling)]

Upon completion of the laminating process (step S4), a drilling process (S5) is performed. More specifically, the boards which are laminated (to be referred to a "laminated board") are arranged at a predetermined position, and a hole is formed at an appropriate position to form a through hole.

Figure 7:
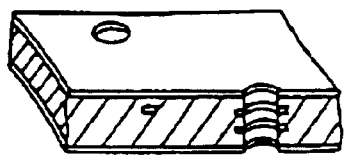
FIG. 7 is a perspective view for explaining a drilling process.
Figure 8:
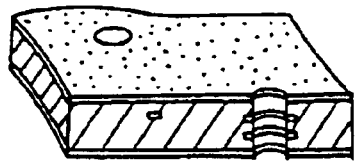
FIG. 8 is a perspective view for explaining a chemical copper plating process.
Figure 9:
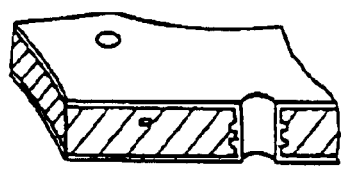
FIG. 9 is a perspective view for explaining an electric copper plating process.

More specifically, the CAM data related to the drilling position is given from the manufacture control device 11 to an NC drilling device (not shown), and the NC drilling device drills the laminated board according to the CAM data (see FIG. 7).

[Copper Plating]

Upon completion of the drilling process (step S5), a copper plating step (step S6) is performed to the laminated board. More specifically, first, chemical copper plating is performed to the laminated board (see FIG. 8). Thereafter, electric copper plating is performed (see FIG. 9). In this manner, the laminated internal layer circuits are connected to each other by a conductor through the through holes.

[Outer Layer Circuit Forming]

Upon completion of the copper plating process (step S6), an outer layer circuit forming process (step S7) is performed to one surface or both the surfaces (outer layers) of the laminated board. The outer layer circuit forming process for the respective surfaces is the same as the internal layer circuit forming process described above.

Figure 10:
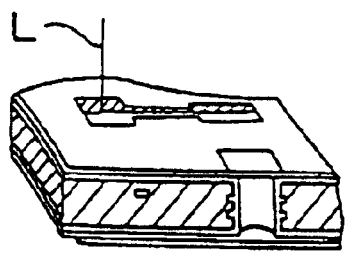
FIG. 10 is a perspective view for explaining an outer layer circuit forming process.
Figure 11:
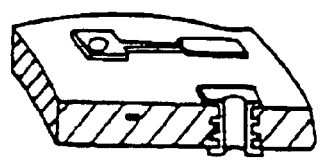
FIG. 11 is a perspective view for explaining an outer layer circuit forming process.

More specifically, a photosensitive film of the same type as that of the photosensitive film used in the internal layer circuit forming process (step S1) are laminated on the respective surfaces of the laminated board, and the laminated boards are arranged at a predetermined position. Thereafter, as shown in FIG. 10, the laser irradiation device 13 irradiates a laser beam L having an output of 5 millijoule to draw a positive pattern corresponding to the conductive pattern of the outer layer circuit on the respective surfaces of the laminated board according to CAM data related to the conductive pattern of the outer layer circuit.

Thereafter, an etching resist of the outer layer circuit is formed such that the photosensitive film of the negative pattern portion is removed by a developing process, and etching is performed according to the etching resist. Thereafter, when the etching resist is removed, conductive patterns of outer layer circuits are formed on both the surfaces of the laminated board (see FIG. 11).

[AOI and Intermediate Inspection]

Upon completion of the outer layer circuit forming process (step S7), the AOI for the laminated board is performed according to the CAT data given from the manufacture control device 11 (step S8). When the laminated board passes the AOI, an intermediate inspection is performed (step S9).

[Solder Resist Forming]

When the laminated board passes the intermediate inspection (step S9), a solder resist forming process for the laminated board is executed (step S10). At present, the solder resist material has the following circumstances.

A solder resist (permanent resist) requires heat resistance (which can withstand the temperature in board laminating or the temperature of soldering) and resistance to moisture (for securing insulating properties) for a long period of time. As a material which satisfies the condition, an epoxy resin is known.

However, the epoxy resin has no photosensitivity or rarely has photosensitivity. For this reason, the solder resist material having photosensitivity is manufactured by adding a small amount of acrylic resin which have poor heat resistance but high photosensitivity in comparison with the epoxy resin.

Therefore, when the amount of acrylic resin is increased with respect to the amount of epoxy resin, the photosensitivity of the solder resist material can be increased. However, in inverse proportion to this, the heat resistance and the resistance to moisture (to be referred to as "heat resistance or the like") of the solder resist material are deteriorated (because the amount of epoxy resin decreases).

Therefore, the heat resistance or the like is superior to the photosensitivity in a recent solder resist material. In this circumstance, a small amount of acrylic resin is added to the epoxy resin, so that the solder resist material has the heat resistance or the like and the photosensitivity which are opposite to each other. Since the amount of acrylic resin is small, the photosensitivity of the solder resist material becomes poor.

This is because an ultraviolet laser having a low output cannot appropriately expose the solder resist material (very long time is required to expose the solder resist material by direct irradiation of the recent ultraviolet laser).

Figure 12:
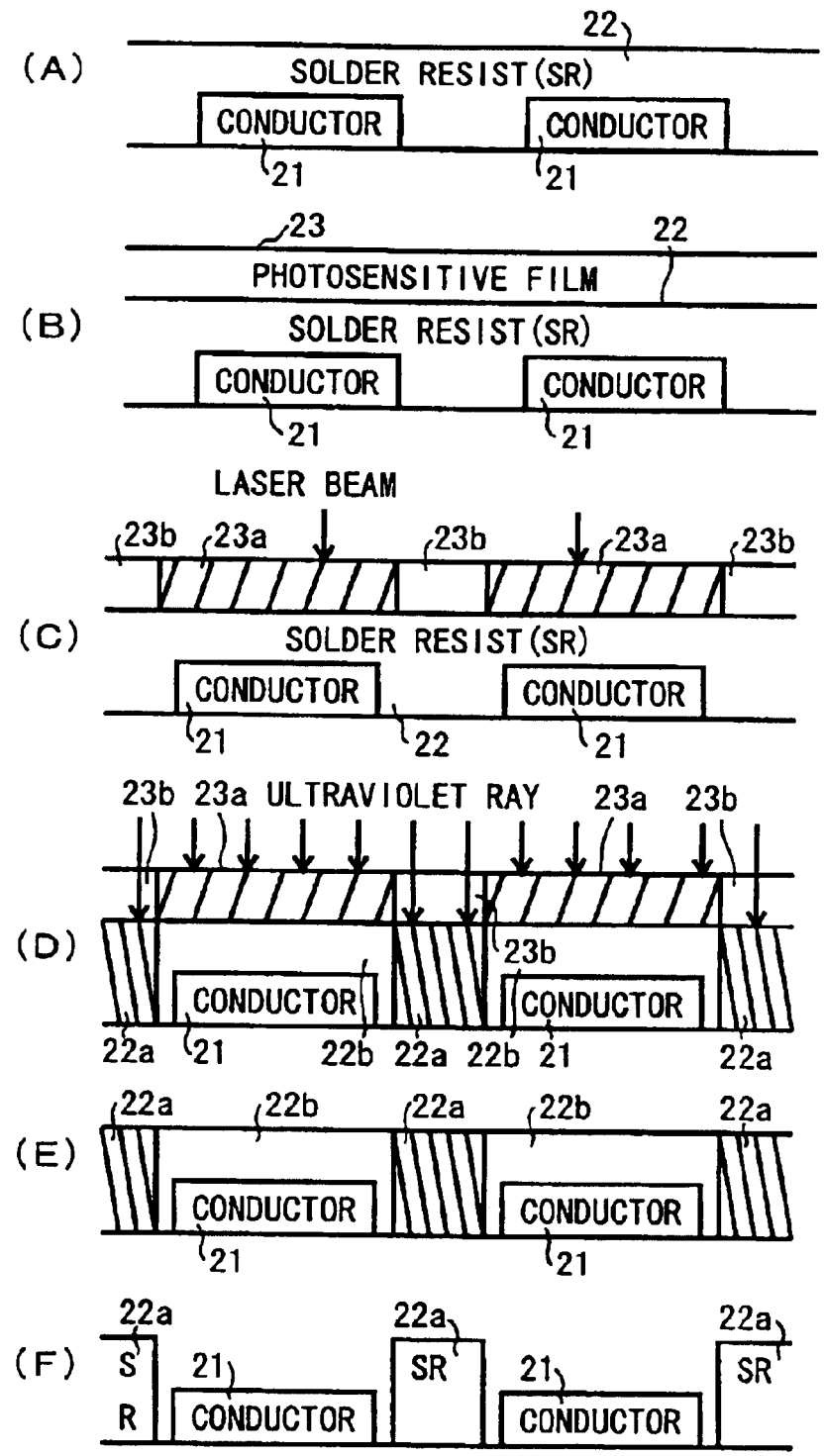
FIGS. 12A to 12F are sectional views for explaining a solder resist forming process.
Figure 13:
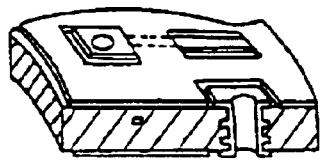
FIG. 13 is a perspective view for explaining a solder resist forming process.
Figure 14:
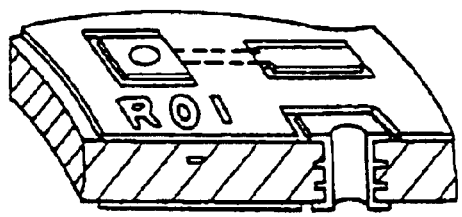
FIG. 14 is a perspective view for explaining a marking process.

In consideration of the circumstances, in this embodiment, the solder resist forming process is performed by the following manner. More specifically, as shown in FIG. 12A, the surface on which the outer layer circuits (conductors 21 in FIG. 12) of the laminated board is coated with an ultraviolet hardening solder resist material 22. In this example, as the solder resist material, PSR-4000 available from Taiyo Ink corporation is used. As the coating consisting of the solder resist material, a liquid solder resist material may be coated, or a sheet-like solder resist material is placed.

As shown in FIG. 12B, the solder resist material 22 is coated with a photosensitive film 23 which is exposed by a laser beam from the laser irradiation device 13 and transformed to have such a nature that ultraviolet rays are absorbed and shield, and then arranged at a predetermined position.

At this time, as shown in FIG. 12C, the laser irradiation device 13 irradiates a laser beam (5 millijoule) by raster scanning according to the CAM data related to the pattern of the solder resist given by the manufacture control device 11.

In this case, the photosensitive film 23 is separated into a portion (exposed portion 23a) which is exposed by the laser beam and a portion (unexposed portion 23a) which is not exposed, and the exposed portion 23a has such a nature that the exposed portion 23a is hardened and absorbs ultraviolet rays. In this manner, a light shielding mask for forming a solder resist is formed.

As shown in FIG. 12D, ultraviolet rays (about 500 millijoule) is irradiated on the photosensitive film by an ultraviolet source (not shown). At this time, the exposed portion 23a (light shielding mask) of the photosensitive film 23 absorbs ultraviolet rays and shields the ultraviolet rays.

For this reason, the ultraviolet rays are irradiated on a portion (non-shielded portion 22a) which is not shielded by the exposed portion 23a of the solder resist material 22, and are not irradiated on the portion (shielded portion 22b) which is shielded. In this manner, of the solder resist material 22, only the non-shielded portion 22a is hardened.

Thereafter, as shown in FIG. 12E, after the photosensitive film 23 is removed, the solder resist on a portion on which the laser beam is not irradiated is removed by a known developing process (see FIG. 12F). In this manner, a solder resist is formed. The conductors 21 constituting the outer layer circuits are exposed. More specifically, the laminated board is set in a state shown in FIG. 13.

As described above, in the solder resist forming process (step S10), a disposable light shielding mask is formed by drawing a solder resist pattern on the photosensitive film by a laser beam, and an exposure process is performed by using the light shielding mask. The present inventor calls this method an "indirect laser exposure method", an "indirect drawing method", or an "indirect method".

The formed light shielding mask is wasted after the light shielding mask is used once. More specifically, according to the present invention, a disposable art work film is formed in the solder resist forming process.

In the solder resist forming process, a photo-softening solder resist material may be used, and the light shielding mask may be formed such that the laser irradiation device 13 irradiates the ultraviolet rays on a portion from which the solder resist material must be removed.

[Marking]

Upon completion of the solder resist forming process (step S10), the marking step (step S11) is performed to the laminated board. More specifically, a photo-hardening marking ink (e.g., white ink) is coated and dried at predetermined positions of both the surfaces of the laminated board.

The marking ink is coated with the photosensitive film 23 which is exposed by the laser beam from the laser irradiation device 13 and transformed to have such a nature that the ultraviolet rays are absorbed and shielded, and the laminated board is arranged at a predetermined position.

At this time, the laser irradiation device 13 irradiates a laser beam by raster scanning according to the CAM data related to the pattern of marking information (character or symbol) given by the manufacture control device 11.

In this case, the photosensitive film is separated into a portion (exposed portion) which is exposed by the laser beam and a portion (unexposed portion) which is not exposed, and the exposed portion has such a nature that the exposed portion is hardened and absorbs ultraviolet rays. In this manner, a light shielding mask for the marking step is formed.

By an ultraviolet source (not shown), ultraviolet rays are irradiated toward the photosensitive film. At this time, the exposed portion of the photosensitive film (a light shielding mask) absorbs the ultraviolet rays and shield the rays. Therefore, the ultraviolet rays are irradiated on a portion (non-shielded portion) which is not shielded by the exposed portion of the marking ink, and are not irradiated on a portion (shielded portion) which is shielded. In this manner, only the marking ink on the non-shielded portion is hardened.

Thereafter, after the photosensitive film is removed, the marking ink on the portion on which the laser beam is not irradiated is removed by a known development process (see FIG. 12F). In this manner, marking is performed to the laminated board. More specifically, the laminated boards are set in the state shown in FIG. 14.

As described above, according to this embodiment, a light shielding mask for the marking process is formed by the same method ("indirect laser exposure method") as that of the solder resist forming process, and an exposure process for the marking ink is performed by using the light shielding mask. Therefore, even in the marking process, use of an art work film which must be reserved can be excluded.

Time required for the marking process according to this embodiment does not considerably deteriorate the manufacturing efficiency of a multi-layer printed wiring board in comparison with time required for the marking process using an art work film.

[NC V Cut and NC Rooter]

Upon completion of the marking process (step S11), at least one of cut lines for dividing a printed wiring board into a plurality of pieces are made as needed on a client side (NC V cut: S12) is incised the laminated board. Next, the laminated board is cut along the shape of a printed wiring board as a product(NC router: step S13). In this manner, the laminated board becomes at least one of pieces as the print wiring board.

The steps S11–S13 described above is performed such that an NC machine tool (V cut device: e.g., router (cutting device)) operates according to CAM data given by the manufacture control device 11.

[Flying Prover and Final Inspection]

When the at least one of pieces is made from the laminated board, a flying prover which is one of wiring tests is performed to each piece (step S14). More specifically, a test device (not shown) executes a continuity test according to CAT data given by the manufacture control device 11.

When the piece clears the continuity test, a final test is performed (step S15). When the piece clears the final test, the piece of the multi-layer printed wiring board is completed. Thereafter, the completed multi-layer printed wiring board is shipped as a product.

The present inventor calls the processes in the internal layer circuit forming process (step S1), the outer layer circuit forming process (step S7), the solder resist forming process (step S10), and the marking process (step S11) a data direct image (DDI). Because, a conductive pattern, a solder resist pattern, or a marking pattern is directly drawn on a board or a photosensitive film by a laser beam on the basis of the CAM data.

[Function of Embodiment]

According to the processes in manufacturing a multi-layer printed wiring board (manufacturing method) according to this embodiment, in the solder resist forming process (step S10) a disposable light shielding mask is formed by a so-called "indirect laser exposure method" to be used in an exposure process.

In this manner, when the solder resist forming process is performed, the following processes need not be performed. That is, the corresponding art work film is looked for from a keeping area and arranged at a predetermined position, and the art work film is kept again upon completion of the process.

Therefore, the manufacturing cost and the keeping cost of an art work film can be cut. Since the manufacturing cost of the light shielding mask is smaller than the manufacturing cost and the keeping cost of the art work film, the present invention can contribute to a reduction in manufacturing cost of a multi-layer printed wiring board. In particular, under the state of a flexible manufacturing system (under the state in which approximately five printed wiring boards of a certain drawing number are formed), the present invention is effective.

Since the photosensitive film 23 is designed to be exposed by a light intensity (5 millijoule) which is lower than a light intensity (500 millijoule) which is required to expose a solder resist material. Time required to form a light shielding mask is not considerably longer than time for preparing a conventional art work film.

For this reason, time required for the solder resist forming process of this embodiment is not considerably longer than time required for the solder resist forming process using a conventional art work film. Therefore, the manufacturing efficiency of a multi-layer printed wiring board is not considerably degraded in comparison with the conventional manufacturing efficiency.

In addition, since the "indirect laser exposure method" is also used in the marking process (step S11), an advantage obtained by excluding use of an art work film can be achieved.

According to this embodiment, in the internal layer circuit forming process (step S1) and the outer layer circuit forming process (step S7), an etching resist is formed by laser beam irradiation performed by the laser irradiation device 13. In the solder resist forming process (step S10), a light shielding mask is formed by using a photosensitive film used in the internal layer circuit forming process (step S1) and the outer layer circuit forming process (step S7).

Therefore, since an art work film is not used in the steps S1, S7, S10, and S11 described above, the process of preparing an art work film and arranging the art work film at a predetermined position need not be performed in the processes in manufacturing a multi-layer printed wiring board, and costs related to manufacturing and keeping the art work film can be cut.

In the internal layer circuit forming process (step S1), the outer layer circuit forming process (step S7), the solder resist forming process (step S10), and the marking process (step S11) described above, processes are executed by using the laser irradiation device 13 in common. For this reason, the number of devices related to manufacturing of a multi-layer printed wiring board can be reduced.

[Modification]

In this embodiment, as the photosensitive film 23, a photosensitive film in which a portion on which a laser beam is irradiated is hardened and which is transformed to have such a nature that ultraviolet rays are absorbed and shielded is used. In place of the photosensitive film, a photosensitive film which has such a nature that an exposure wavelength of a solder resist material or a marking material is absorbed in advance and which is hardened in an exposure state may also be used. In this case, when the developing process is performed after a laser beam is irradiated on the photosensitive film, a portion which is not exposed is removed, and the remaining portion prevents an solder resist material or a marking material from being exposed to light from an exposure light source in an exposure process because of the nature which is kept by the photosensitive film in advance.

In this embodiment, the laser irradiation device 13 is designed to irradiate a visible laser beam. However, an ultraviolet laser having a wavelength range which does not overlap the wavelength range of the ultraviolet rays used in the exposure process of the solder resist forming process may be used.

As a photosensitive film, a photosensitive film which shields ultraviolet rays in case of hardening may also be used. In this case, a photosensitive film used in the internal layer circuit forming process and the outer layer circuit forming process and a photosensitive film used in the solder resist forming process can be shared, and the manufacturing cost can be reduced.

This embodiment explains a case in which one laser irradiation device 13 is prepared and used in the internal layer circuit forming process, the outer layer circuit forming process, the solder resist forming process, and the marking process. The same laser irradiation device 13 may be prepared in the internal layer circuit forming process, the outer layer circuit forming process, the solder resist forming process, and the marking process.

In this embodiment, although a so-called "indirect laser exposure method" is used in the marking step, a "direct laser exposure method" (to be described below) may be used.

More specifically, a photo-hardening making ink (white ink) is coated and dried at predetermined positions of both the surfaces of a laminated board. Thereafter, the laser irradiation device 13 irradiates a laser beam on a portion where the marking ink must be left according to CAM data related to marking given by the manufacture control device 11. In this manner, the marking ink on the portion on which the laser beam is irradiated is hardened.

Thereafter, by known developing and cleaning processes, the marking ink on the portion on which the laser beam is not irradiated is removed. In this manner, a state in which marking is performed at an appropriate position of a laminated board (mark or character is printed) is set (see FIG. 14).

A photo-softening marking ink may be used in the marking step, and the laser irradiation device 13 may irradiate a laser beam on only a portion from which the marking ink must be removed.

According to the present invention, the laser beam may have such a wavelength range that a photosensitive film is exposed but a solder resist material is not exposed.

What is claimed is:

1. A method of manufacturing a multi-layer printed wiring board comprising an internal layer circuit forming step, an outer layer circuit forming step, and a solder resist forming step, wherein the inertial layer circuit forming step and the outer layer circuit forming step comprise steps of:

providing a board coated with a patterning material;

coating the surface of the patterning material with a photosensitive film;

exposing the photosensitive film according to a predetermined conductive pattern;

forming an etching resist by removing a portion of the photosensitive film which is not exposed from the board;

removing the patterning material from the board according to the etching resist; and removing the etching resist from the board, and the solder resist forming step comprises steps of:

coating the surface of the board subjected to the outer layer circuit forming step with a photosensitive solder resist material;

coating the solder resist material with a photosensitive film;

irradiating a laser beam on the photosensitive film according to a formed pattern of the solder resist, to form a light shielding mask having an exposed portion that absorbs an ultraviolet ray and an unexposed portion that does not absorb the ultraviolet ray;

exposing the solder resist material to an ultraviolet ray through the unexposed portion of the light shielding mask;

removing the light shielding mask; and removing the solder resist material which is not exposed due to the light shielding mask.

2. A method of manufacturing a multi-layer printed wiring board according to claim 1, wherein the laser beam has an output or a wavelength range such that the photosensitive film is exposed but the solder resist material is not exposed.

3. A method of manufacturing a multi-layer printed wiring board according to claim 1, wherein the photosensitive film forms the light shielding mask such that a portion on which the laser beam is irradiated is transformed to have such a nature that ultraviolet rays are shielded, and the ultraviolet rays are irradiated on the solder resist material through the light shielding mask in the exposure step.

4. A method of manufacturing a multi-layer printed wiring board according to claim 2, wherein the photosensitive film forms the light shielding mask such that a portion on which the laser beam is irradiated is transformed to have such a nature that ultraviolet rays are shielded, and the ultraviolet rays are irradiated on the solder resist material through the light shielding mask in the exposure step.

5. A method of manufacturing a multi-layer printed wiring board according to claim 1, further comprising a marking step comprising steps of:
- coating a marking position on a board surface, after the solder resist forming step, with a photosensitive marking material;
- coating the marking material with a photosensitive film;
- forming a light shielding mask by irradiating a laser beam on the marking material according to marked information;
- exposing the marking material by using the light shielding mask;
- removing the light shielding mask; and
- removing the marking material which is not exposed due to the light shielding mask.

6. A method of manufacturing a multi-layer printed wiring board according to claim 2, further comprising a marking step comprising steps of:
- coating a marking position on a board surface, after the solder resist forming step, with a photosensitive marking material;
- coating the marking material with a photosensitive film;
- forming a light shielding mask by irradiating a laser beam on the marking material according to marked information;
- exposing the marking material by using the light shielding mask;
- removing the light shielding mask; and
- removing the marking material which is not exposed due to the light shielding mask.

7. A method of manufacturing a multi-layer printed wiring board according to claim 3, further comprising a marking step comprising steps of:
- coating a marking position on a board surface, after the solder resist forming step, with a photosensitive marking material;
- coating the marking material with a photosensitive film;
- forming a light shielding mask by irradiating a laser beam on the marking material according to marked information;
- exposing the marking material by using the light shielding mask;
- removing the light shielding mask; and
- removing the marking material which is not exposed due to the light shielding mask.

8. A method of manufacturing a multi-layer printed wiring board according to claim 1, further comprising a marking step comprising steps of:
- coating a marking position on a board surface, after the solder resist forming step, with a photosensitive marking material;
- irradiating a laser beam on the marking material according to marked information; and removing the marking material except for the marking material on a portion where the marking material is hardened by irradiation of the laser beam.

9. A method of manufacturing a multi-layer printed wiring board according to claim 2, further comprising a marking step comprising steps of:
- coating a marking position on a board surface, after the solder resist forming step, with a photosensitive marking material;
- irradiating a laser beam on the marking material according to marked information; and
- removing the marking material except for the marking material on a portion where the marking material is hardened by irradiation of the laser beam.

10. A method of manufacturing a multi-layer printed wiring board according to claim 3, further comprising a marking step comprising steps of:
- coating a marking position on a board surface, after the solder resist forming step, with a photosensitive marking material;
- irradiating a laser beam on the marking material according to marked information; and
- removing the marking material except for the marking material on a portion where the marking material is hardened by irradiation of the laser beam.

11. A method of manufacturing a multi-layer printed wiring board according to claim 1, further comprising a marking step comprising steps of:
- coating a marking position on a board surface, after the solder resist forming step, with a photosensitive marking material;
- irradiating a laser beam on the marking material according to marked information; and
- removing the marking material except for the marking material on a portion where the marking material is softened by irradiation of the laser beam.

12. A method of manufacturing a multi-layer printed wiring board according to claim 2, further comprising a marking step comprising steps of:
- coating a marking position on a board surface, after the solder resist forming step, with a photosensitive marking material;
- irradiating a laser beam on the marking material according to marked information; and
- removing the marking material except for the marking material on a portion where the marking material is softened by irradiation of the laser beam.

13. A method of manufacturing a multi-layer printed wiring board according to claim 3, further comprising a marking step comprising steps of:
- coating a marking coating position on a board surface, after the solder resist forming step, with a photosensitive marking material;
- irradiating a laser beam on the marking material according to marked information; and
- removing the marking material except for the marking material on a portion where the marking material is softened by irradiation of the laser beam.

14. A method of manufacturing a multi-layer printed wiring board according to claim 1, wherein, in the internal layer circuit forming step and the outer layer circuit forming step, an etching resist is formed by using the same laser irradiation device as the laser irradiation device used to form a light shielding mask in the solder resist forming step.

15. A method of manufacturing a multi-layer printed wiring board according to claim 8, wherein photosensitive films of the same type are used in the internal layer circuit forming step, the outer layer circuit forming step, and the solder resist forming step.

16. A method of manufacturing a multi-layer printed wiring board according to claim 5, wherein, in the marking step, a light shielding mask for the marking step is formed by using the same laser irradiation device as the laser irradiation device used to form a light shielding mask in the solder resist forming step.

* * * * *

UNITED STATES PATENT AND TRADEMARK OFFICE
CERTIFICATE OF CORRECTION

PATENT NO. : 6,893,576 B1  
DATED : May 17, 2005  
INVENTOR(S) : Nakayama et al.

It is certified that error appears in the above-identified patent and that said Letters Patent is hereby corrected as shown below:

Column 12,
Line 17, "inertial" should read -- internal --.

Column 14,
Line 40, "coating a marking coating position" should read -- coating a marking position --.

Signed and Sealed this

Thirteenth Day of December, 2005

JON W. DUDAS
*Director of the United States Patent and Trademark Office*